(12) United States Patent
Amagai et al.

(10) Patent No.: US 9,758,725 B2
(45) Date of Patent: Sep. 12, 2017

(54) FLUORESCENT MATERIAL AND LIGHT-EMITTING DEVICE

(71) Applicant: Ube Industries, Ltd., Ube-shi (JP)

(72) Inventors: Jin Amagai, Ube (JP); Kouichi Fukuda, Ube (JP)

(73) Assignee: Ube Industries, Ltd., Ube-shi (JP)

( * ) Notice: Subject to any disclaimer, the term of this patent is extended or adjusted under 35 U.S.C. 154(b) by 0 days.

(21) Appl. No.: 15/112,215

(22) PCT Filed: Jan. 21, 2015

(86) PCT No.: PCT/JP2015/051554
§ 371 (c)(1),
(2) Date: Jul. 18, 2016

(87) PCT Pub. No.: WO2015/111626
PCT Pub. Date: Jul. 30, 2015

(65) Prior Publication Data
US 2016/0333266 A1  Nov. 17, 2016

(30) Foreign Application Priority Data

Jan. 22, 2014  (JP) .................................. 2014-009368

(51) Int. Cl.
*H01L 33/50*  (2010.01)
*C09K 11/77*  (2006.01)

(52) U.S. Cl.
CPC ........ *C09K 11/7792* (2013.01); *H01L 33/502* (2013.01)

(58) Field of Classification Search
CPC ..... H01L 33/502; H01L 33/504; H01L 33/50; C09K 11/7792; C09K 11/883; C09K 11/565; C09K 11/025; H02L 33/507
See application file for complete search history.

(56) References Cited

U.S. PATENT DOCUMENTS 9,437,787 B2 * 9/2016 Kamikawa ............ H01L 33/502
2014/0353704 A1 * 12/2014 Kamikawa ............ H01L 33/502
257/98

FOREIGN PATENT DOCUMENTS

| CN | 101126023 A | 2/2008 |
|---|---|---|
| CN | 102337122 A | 2/2012 |
| JP | 2008266410 A | 11/2008 |
| JP | 2013136697 A | 7/2013 |
| KR | 1020110085491 A | 7/2011 |

OTHER PUBLICATIONS

Kang et al., "The enhancement of photoluminescence characteristics of Eu-doped barium strontium silicate phosphor particles by co-doping materials", Journal of Alloys and Compounds, 2005, pp. 246-250, 402.

* cited by examiner

*Primary Examiner* — Nikolay Yushin
(74) *Attorney, Agent, or Firm* — The Webb Law Firm

(57) ABSTRACT

There is provided a fluorescent material having a composition represented by the following Formula (1). $(Sr_a, Ba_b, Eu_x, M^1{}_1, M^2{}_e)SiO_f \cdot cMgO$ ... Formula (1) (In the formula, $M^1$ is at least one tertiary group element selected from Y and Tb; $M^2$ is an alkali metal selected from Li, Na, and K; and $0<a<2$, $0<b<2$, $0\leq c<1$, $0.001\leq d\leq 0.06$, $0\leq e\leq 0.06$, $0<x<0.1$, and $3.7\leq f\leq 4.1$ are set.) Further, there is provided a light-emitting device including: the fluorescent material; and a light source irradiating the fluorescent material with excitation light to cause the fluorescent material to emit light.

7 Claims, No Drawings

FLUORESCENT MATERIAL AND LIGHT-EMITTING DEVICE

CROSS-REFERENCE TO RELATED APPLICATIONS

This application is the United States national phase of International Application No. PCT/JP2015/051554 filed Jan. 21, 2015, and claims priority to Japanese Patent Application No. 2014-009368 filed Jan. 22, 2014, the disclosures of which are hereby incorporated in their entirety by reference.

TECHNICAL FIELD

The present invention relates to a fluorescent material and a light-emitting device, and particularly relates to a silicate-based fluorescent material and a light-emitting device using the same.

BACKGROUND ART

Conventionally, a white light-emitting LED is widely used, which is of a double color admixture type of which white light is produced by combining a semiconductor light-emitting element releasing blue light with a yellow light-emitting fluorescent material to mix the blue light and yellow light. However, there is a problem in that the white light emitted by the white light-emitting LED of the double color admixture type is not sufficiently pure. Therefore, recently, there is developed a white light-emitting LED of a triple color admixture type which combines a semiconductor light-emitting element emitting ultraviolet light (wavelength: 350 to 430 nm) with a blue, green, and red light-emitting fluorescent materials to excite the fluorescent materials with light released from the semiconductor light-emitting element, thereby giving white light by mixing blue light, green light, and red light.

Conventionally, green light-emitting fluorescent materials having various compositions have developed. For example, in Patent Literature 1, a fluorescent material equivalent to $(Ba,Sr)_2SiO_4$:Eu is described as the green light-emitting fluorescent material used for LEDs or the like. The present literature describes that, at least one of an alkali metal element, an alkali earth metal element, Zn, Y, Al, Sc, P, N, a rare earth element, and a halogen element is contained as a trace element, and the content of the trace element is usually 1 ppm to 100 ppm are described. However, examples in which the trace element is added are not described.

In Patent Literature 2, a green light-emitting silicate fluorescent material containing Eu-activated strontium barium silicate and 0.15 to 0.90 mol of magnesium per 1 mol of the content of silicon is described.

CITATION LIST

Patent Literature

Patent Literature 1: JP 2008-266410 A (claim 10, paragraphs 0052 and 0053, or the like)
Patent Literature 2: JP 2013-136697 A (claim 1)

SUMMARY OF INVENTION

Technical Problem

The green light-emitting fluorescent material described in Patent Literature 1 has insufficient light-emitting property. In particular, the green light-emitting fluorescent material disadvantageously has a low internal quantum efficiency and a low external quantum efficiency. The green light-emitting silicate fluorescent material described in Patent Literature 2 has light-emitting intensity having high stability against heat, but a further improvement in the light-emitting property is expected.

It is an objective of the present invention to provide a fluorescent material having more excellent light-emitting property than that of a conventional fluorescent material, and a light-emitting device using the same.

Solution to Problem

In order to achieve the above objective, the present inventors made earnest researches. As a result of their studies, the inventors have found that a fluorescent material containing Eu-activated strontium barium silicate contains a predetermined tertiary group element to allow good light-emitting property.

That is, the present invention relates to a fluorescent material having a composition represented by the following Formula (1).

$$(Sr_a,Ba_b,Eu_x,M^1_d,M^2_e)SiO_f \cdot cMgO \qquad \text{Formula (1)}$$

(In the formula, $M^1$ is at least one tertiary group element selected from Y and Tb; $M^2$ is an alkali metal selected from Li, Na, and K; and $0<a<2$, $0<b<2$, $0\leq c<1$, $0.001\leq d\leq 0.06$, $0\leq e\leq 0.06$, $0<x<0.1$, and $3.7\leq f\leq 4.1$ are set.)

Further, the present invention relates to a light-emitting device including: the above fluorescent material; and a light source irradiating the fluorescent material with excitation light to cause the fluorescent material to emit light.

Advantageous Effects of Invention

The present invention can provide a fluorescent material having excellent light-emitting property and a light-emitting device using the same.

BEST MODE FOR CARRYING OUT THE INVENTION

1. Fluorescent Material

A fluorescent material of the present invention has a composition represented by the following Formula (1).

$$(Sr_a,Ba_b,Eu_x,M^1_d,M^2_e)SiO_f \cdot cMgO \qquad \text{Formula (1)}$$

(In the formula, $M^1$ is at least one tertiary group element selected from Y and Tb; $M^2$ is an alkali metal selected from Li, Na, and K; and $0<a<2$, $0<b<2$, $0\leq c<1$, $0.001\leq d\leq 0.06$, $0\leq e\leq 0.06$, $0<x<0.1$, and $3.7\leq f\leq 4.1$ are set.)

In other words, the fluorescent material of the present invention is a green light-emitting silicate fluorescent material containing Eu-activated strontium barium silicate, at least one tertiary group element selected from yttrium (Y) and terbium (Tb), and magnesium (Mg) as an optional ingredient.

In Formula (1), $M^1$ is at least one tertiary group element selected from Y and Tb, and contains Y or Tb, or both Y and Tb. Among these, Y is more preferable because of its high internal quantum efficiency and external quantum efficiency.

The molar ratio of $M^1$ to 1 mol of Si, i.e., the value of d is within the range of $0.001\leq d\leq 0.06$, preferably within the range of $0.0015\leq d\leq 0.05$, and more preferably within the range of $0.0025\leq d\leq 0.03$. Even if the value of d is less than 0.001, or more than 0.06, the internal quantum efficiency and the external quantum efficiency are decreased, which is apt to cause deterioration in light-emitting property. The content of $M^1$ is preferably within the range of 500 to 16000 ppm based on mass standard per the total amount of the fluorescent material, and more preferably within the range of 1500 to 13000 ppm. Even if the content of $M^1$ is less than 500 ppm, or more than 16000 ppm, the internal quantum efficiency and the external quantum efficiency are decreased, which is apt to cause deterioration in light-emitting property.

The molar ratio of strontium to 1 mol of Si, i.e., the value of a is within the range of 0<a<2, preferably within the range of 1≤a≤1.5, and more preferably within the range of 1.2≤a≤0.96. The half-value breadth of a light-emitting spectrum is apt to become narrower as the value of a is closer to 0. When the value of a is 2 or more, light-emitting intensity is apt to be decreased.

The molar ratio of barium to 1 mol of Si, i.e., the value of b is within the range of 0<b<2, preferably within the range of 0.5≤b≤0.98, and more preferably within the range of 0.6≤b≤0.96. Light-emitting intensity is apt to be decreased as the value of b is closer to 0. When the value of b is 1 or more, the half-value breadth of a light-emitting spectrum is apt to become narrower.

Europium is an activator, and emits light as a light-emitting atom in the fluorescent material. The molar ratio of europium to 1 mol of Si, i.e., the value of x is within the range of 0<x<0.1, preferably within the range of 0.01≤x≤0.07, and more preferably within the range of 0.02≤x≤0.05 and most preferably between 0.025≤x≤0.03. The light-emitting atoms are decreased as the value of x is closer to 0, which is apt to cause a decrease in light-emitting intensity. When the value of x is 0.1 or more, the concentration of the light-emitting atoms is increased, which causes the proximity of the light-emitting atoms to each other to negate the light emissions. This is apt to cause a decrease in the light-emitting intensity.

In the present invention, magnesium is an optional ingredient. However, the internal quantum efficiency and external quantum efficiency of the fluorescent material when the fluorescent material contains magnesium are higher than those when the fluorescent material does not contain magnesium, which is preferable. The molar ratio of magnesium to 1 mol of Si, i.e., the value of c is within the range of 0≤c<1, preferably within the range of 0.15≤c≤0.90, and more preferably within the range of 0.20≤c≤0.80. c=0 represents a composition containing no magnesium. The fluorescent material containing magnesium is a mixture containing a fluorescent material represented by "$(Sr_a,Ba_b,M_d)SiO_4:Eu_x$" or a fluorescent material represented by "$Sr_{a-\alpha}, Ba_{b-\beta}, M^1{}_d, Mg_{\alpha+\beta})SiO_f:Eu_x$" (0≤α+β≤0.2), and MgO or the like. For example, the fluorescent material can be obtained by firing so that strontium element:barium element:magnesium element:$M^1$ element:silicon element:europium element=a:b:c:d:1:x is set at the molar ratio of raw materials in a producing method to be described later.

In the present invention, an alkali metal element ($M^2$) can be further contained as an optional ingredient. Since the alkali metal element has a function of sensitizing $M^1$ as the tertiary group element in the fluorescent material to improve the internal quantum efficiency and the external quantum efficiency, the fluorescent material preferably contains the alkali metal element. The alkali metal element is preferably one or more selected from lithium (Li), sodium (Na), and potassium (K). When the molar ratio of the alkali metal element to 1 mol of Si is defined as e, the alkali metal element equimolar to $M^1$ (1:1 at a molar ratio, i.e., e=d) is preferably contained in the fluorescent material. When the alkali metal (element $M^2$) is contained, the content of the alkali metal is preferably within the range of 0.001≤e≤0.06, more preferably within the range of 0.0015≤e≤0.05, and particularly preferably within the range of 0.0025≤e≤0.03. e=0 represents a composition containing no alkali metal element.

When the fluorescent material of the present invention does not contain the alkali metal element ($M^2$), the fluorescent material can be represented by the following Formula (2):

$(Sr_a,Ba_b,Eu_x,M^1{}_d)SiO_f \cdot cMgO$   Formula (2)

wherein: $M^1$ is at least one tertiary group element selected from Y and Tb; and 0<a<2, 0<b<2, 0≤c<1, 0.0015 d 0.045, 0<x<0.1, and 3.7 f 4.1 are set.

In Formula (1), f is within the range of 3.7 f 4.1, and preferably 3.8 f 4.0, and more preferably f=3.9. When f is less than 3.7, or more than 4.1, the light-emitting efficiency is apt to be decreased.

The fluorescent material of the present invention emits green light having a peak wavelength of 510 to 530 nm when it is excited by light having a wavelength of 400 nm. Furthermore, the fluorescent material of the present invention preferably emits blue light having a peak wavelength of 435 to 450 nm in addition to the green light. The light-emitting intensity of the blue light is preferably 0.0015 to 0.020, and particularly preferably 0.005 to 0.010, per 1 of the light-emitting intensity of the green light.

Since the fluorescent material of the present invention contains at least one tertiary group element selected from Y and Tb as described above, and has the composition of Formula (1), particularly, the light-emitting property shown by the internal quantum efficiency or the external quantum efficiency is more excellent than that of the conventional fluorescent material. The internal quantum efficiency means generated photon number to absorbed excitation photon number. On the other hand, the external quantum efficiency means external generated photon number to irradiated photon number, and can be calculated by the formula of "internal quantum efficiency x absorption factor". Since the external quantum efficiency means a light emission amount to photon number irradiated from an excitation source, particularly, in a light-emitting device such as a white light-emitting LED, the external quantum efficiency is a parameter more important than the internal quantum efficiency. The fluorescent material of the present invention has a more excellent external quantum efficiency than that of the conventional fluorescent material. Specifically, the external quantum efficiency when being excited by excitation light having a wavelength of 400 nm can be set to 66% or more, preferably 67% or more, and more preferably 68% or more. Herein, the external quantum efficiency can be calculated by a method described in Examples to be described later.

2. Method for Producing Fluorescent Material

For example, the fluorescent material of the present invention can be produced by mixing a powdery strontium compound, a powdery barium compound, a powdery silicon compound, a powdery $M^1$-containing compound, a powdery europium compound, and a powdery $M^2$-containing compound, a powdery magnesium compound if needed, and firing the obtained powdery mixture.

Each of powdery raw materials of the powdery strontium compound, the powdery barium compound, the powdery silicon compound, the powdery M-containing compound, the powdery europium compound, the powdery $M^2$-containing compound, and the powdery magnesium compound may be a powdery oxide or a powdery compound generating an oxide by heating a hydroxide, a halide, a carbonate (including a basic carbonate), a nitrate, and an oxalate or the like.

Specific examples of the powdery strontium compound to be used include, but are not particularly limited to, one or more selected from the group consisting of strontium carbonate ($SrCO_3$), strontium hydroxide ($Sr(OH)_2$), strontium fluoride ($SrF_2$), strontium bromide ($SrBr_2$), strontium chloride ($SrCl_2$), and strontium iodide ($SrI_2$).

Specific examples of the powdery barium compound to be used include, but are not particularly limited to, one or more selected from the group consisting of barium carbonate ($BaCO_3$), barium hydroxide ($Ba(OH)_2$), barium fluoride ($BaF_2$), barium bromide ($BaBr_2$), barium chloride ($BaCl_2$), and barium iodide ($BaI_2$)

Specific examples of the powdery silicon compound to be used include, but are not particularly limited to, one or more selected from the group consisting of silicon dioxide ($SiO_2$), orthosilicic acid ($H_4SiO_4$), metasilicic acid ($H_2SiO_3$), and meta-disilicic acid ($H_2Si_2O_5$)

Specific examples of the powdery magnesium compound to be used include, but are not particularly limited to, one or more selected from the group consisting of magnesium oxide (MgO), magnesium hydroxide ($Mg(OH)_2$), and magnesium carbonate ($MgCO_3$)

The powdery M-containing compound can be selected from a powdery yttrium compound, a powdery terbium compound, and powdery mixtures thereof. Specific examples of the powdery yttrium compound to be used include, but are not particularly limited to, one or more selected from the group consisting of yttrium oxide (III) ($Y_2O_3$) and yttrium hydroxide ($Y(OH)_3$). Specific examples of the powdery terbium compound to be used include, but are not particularly limited to, one or more selected from the group consisting of terbium oxide (III) ($Tb_2O_3$), terbium oxide (III, IV) ($Tb_4O_7$), terbium hydroxide (III) ($Tb(OH)_3$), and terbium hydroxide (IV) ($Tb(OH)_4$).

Specific examples of the powdery europium compound to be used include, but are not particularly limited to, one or more selected from the group consisting of europium oxide (III) ($Eu_2O_3$), europium oxide (II) (EuO), and europium hydroxide (III) ($Eu(OH)_3$).

These powdery raw materials may be used alone or in combination of two or more. Each of the powdery raw materials preferably has a purity of 99% by mass or more.

Since the mixing ratio of the powdery raw materials is the composition ratio of Formula (1) almost as it is, the mixing ratio is adjusted so that a desired composition ratio is set. That is, the powdery strontium compound is mixed so that the number of moles of a strontium element to 1 mol of the content of silicon as the powdery raw material is set to a. The other powdery compound is also the same.

The powdery raw material mixture may contain a flux. The flux is preferably a halide, and particularly preferably a chloride compound. A powdery chloride compound is preferably used for a part of the powdery raw materials as the flux. In particular, a powdery chloride compound of strontium is preferably used. The additive amount of the flux is preferably 0.0001 to 0.5 mol, and particularly preferably 0.01 to 0.5 mol, in terms of the halogen amount, per 1 mol of the silicon content in the powdery mixture.

As a method for mixing the powdery raw materials, both a dry mixing method and a wet mixing method can be used. When the powdery raw materials are mixed by the wet mixing method, a rotating ball mill, a vibrating ball mill, a planetary mill, a paint shaker, a locking mill, a locking mixer, a bead mill, and a stirrer or the like can be used. Water and a lower alcohol such as ethanol or isopropanol can be used for a solvent.

The firing of the powdery mixture is preferably performed in a reducing gas atmosphere. As the reducing gas, a mixture of 0.5 to 5.0 vol. % of hydrogen and 99.5 to 95.0 vol. % of an inert gas can be used. Examples of the inert gas include argon and/or nitrogen. Generally, the firing temperature is within the range of 900 to 1300° C. Generally, the firing time is within the range of 0.5 to 100 hours, and preferably within the range of 0.5 to 10 hours.

When a powdery compound producing an oxide by heating is used as a powdery raw material, a powdery mixture is preferably temporarily fired at a temperature of 600 to 850° C. in an air atmosphere for 0.5 to 100 hours before being fired in a reducing gas atmosphere. The temporary firing time is particularly preferably within the range of 0.5 to 10 hours. The fluorescent material obtained by firing may be treated by procedures such as classification, acid treatment using a mineral acid such as hydrochloric acid or nitric acid, or baking if needed.

3. Light-Emitting Device

The fluorescent material of the present invention can be used for various light-emitting devices. The light-emitting device of the present invention includes at least the fluorescent material represented by Formula (1) and a light source irradiating the fluorescent material with excitation light to cause the fluorescent material to emit light. Specific examples of the light-emitting device include a white light-emitting diode (LED), a fluorescent lamp, a fluorescent display tube (VFD), a cathode-ray tube (CRT), a plasma display panel (PDP), and a field emission display (FED). Among these, the white light-emitting LED is a light-emitting device including a fluorescent material (green light-emitting fluorescent material), red light-emitting fluorescent material, and blue light-emitting fluorescent material of the present invention, and a semiconductor light-emitting element emitting ultraviolet light having a wavelength of 350 to 430 nm, for example. The ultraviolet light from the light-emitting element excites these fluorescent materials to obtain white light from green light, red light, and blue light.

Examples of the blue light-emitting fluorescent material include $(Ba,Sr,Ca)_3MgSi_2O_8$:Eu, $(Ba,Sr,Ca)MgAl_{10}O_{17}$:Eu, and $(Ba,Sr,Mg,Ca)_{10}(PO_4)_6(Cl,F)_2$:Eu. Examples of the red light-emitting fluorescent material include $(Ba,Sr,Ca)_3MgSi_2O_8$:Eu,Mn, $Y_2O_2S$:Eu, $La_2O_3S$:Eu, $(Ca, Sr,Ba)_2Si_5N_8$:Eu, $CaAlSiN_3$:Eu, $Eu_2W_2O_9$, $(Ca, Sr, Ba)_2Si_5N_8$: Eu, Mn, $CaTiO_3$:Pr, Bi, and $(La, Eu)_2W_3O_{12}$. Examples of the semiconductor light-emitting element include an AlGaN-based semiconductor light-emitting element. The light-emitting device can be understood in detail with reference to Patent Literature 2.

EXAMPLES

Hereinafter, the present invention will be specifically described with reference to Examples, but these do not limit the objective of the present invention.

1. Methods for Evaluating Characteristics of Fluorescent Material

Methods for evaluating various characteristics of a fluorescent material are as follows.

<Absorption Factor, Internal Quantum Efficiency, External Quantum Efficiency>

These were measured in the following procedures using FP-8500 manufactured by JUSCO Engineering Corporation.

1) A standard white plate was attached to the inner bottom part of an integrating sphere. The surface of the standard white plate was perpendicularly irradiated with ultraviolet light having a peak wavelength of 400 nm. The spectrum of light scattered by an integrating sphere wall was measured, and the peak area (L1) of light having a wavelength of 380 to 410 nm was measured.

2) A sample holder was filled with a silicate fluorescent material sample, and the sample holder was attached to the inner bottom part of an integrating sphere. The surface of the silicate fluorescent material sample of the sample holder was perpendicularly irradiated with ultraviolet light having a peak wavelength of 400 nm. The spectrum of light scattered by an integrating sphere wall was measured, and the peak area (L2) of light having a wavelength of 380 to 410 nm and the peak area (E) of light having a wavelength of 410 to 700 nm were measured. The absorption factor, internal quantum efficiency, and external quantum efficiency of the silicate fluorescent material sample were calculated from the following formula.

Absorption factor (%)=100×(L1−L2)/L1

Internal quantum efficiency of silicate fluorescent material sample (%)=100×E/(L1−L2)

External quantum efficiency of silicate fluorescent material sample (%)=100×E/L1

2. Experiment Example 1

$M^1$=Y, Li Addition, Mg Additive Free

Example 1-1: $Sr_{0.96}Ba_{0.95}Eu_{0.03}Y_{0.03}L_{0.03}SiO_4$

Powdery strontium carbonate (purity: 99.8% by mass, average particle size: 2.73 m), powdery barium carbonate (purity: 99.8% by mass, average particle size: 1.26 m), powdery europium (III) oxide (purity: 99.9% by mass, average particle size: 2.71 μm), powdery silicon dioxide (purity: 99.9% by mass, average particle size: 3.87 m), powdery strontium fluoride (purity: 99.9% by mass), powdery strontium bromide (purity: 99.9% by mass), yttrium oxide (purity: 99.9% by mass), and lithium carbonate (purity: 99.9% by mass) were weighed so that the molar ratios of $SrCO_3:BaCO_3:Eu_2O_3:SiO_2:SrF_2SrBr_2:Y_2O_3:Li_2CO_3$ were respectively set to 0.94:0.95:0.015:1:0.01:0.01:0.015:0.015 (Table 1). The average particle sizes of the powdery raw materials were measured by a laser diffraction-scattering method.

Each of the weighed powdery raw materials and pure water were placed in a ball mill, and wet-mixed for 24 hours, to obtain a powdery mixture slurry. The obtained slurry was spray-dried by a spray drier to obtain a powdery mixture having an average particle size of 40 μm. The obtained powdery mixture was placed in an alumina crucible and fired at 800° C. for 3 hours in an air atmosphere. Then, the fired powdery mixture was allowed to stand to room temperature, and then fired at 1,200° C. for 6 hours in a mixed gaseous atmosphere containing 2 vol. % of hydrogen and 98 vol. % of argon, to obtain a fluorescent material.

The absorption factor, internal quantum efficiency, and external quantum efficiency of the obtained fluorescent material were measured and calculated. As a result, the absorption factor was 84.6%; the internal quantum efficiency was 81.1%; and the external quantum efficiency was 68.5%. The results are shown in Table 2. The number of oxygens in each composition is a theoretical value calculated with the valences of Sr, Ba, Eu, Si, Mg, and Zn as divalence and the valences of $M^1$, Al, Ce, La, Gd, and W as trivalence.

Comparative Example 1-1

A fluorescent material was obtained in the same manner as in Example 1-1 except that the powdery yttrium oxide of Example 1-1 was not added (Comparative Example 1-1), and mixing was performed so that the mixing ratio of Table 1 was set. The absorption factor, internal quantum efficiency, and external quantum efficiency of the obtained fluorescent material were measured and calculated. The results are shown in Table 2.

3. Experiment Example 2: $M^1$=Y, Li Addition, Mg Addition

Example 2-1

A fluorescent material $(Sr_{0.96}Ba_{0.85}Eu_{0.03}Y_{0.03}Li_{0.03}SiO_{3.9} \cdot 0.3MgO)$ was obtained in the same manner as in Example 1-1 except that powdery magnesium oxide (manufactured by a gas phase method, purity: 99.98% by mass, BET specific surface area: 8 $m^2/g$) was further added in Example 1-1, and mixing was performed so that the mixing ratio of Table 1 was set. The absorption factor, internal quantum efficiency, and external quantum efficiency of the obtained fluorescent material were measured and calculated. The results are shown in Table 2.

Comparative Examples 2-1 to 2-3

Fluorescent materials were obtained in the same manner as in Example 2-1 except that additive free (Comparative Example 2-1), the zinc oxide (Comparative example 2-2) of the experiment example 1, and the aluminum oxide (Comparative Example 2-3) of the experiment example 1 were used in place of the powdery yttrium oxide of Example 2-1, and mixing was performed so that the mixing ratio of Table 1 was set. The absorption factor, internal quantum efficiency, and external quantum efficiency of the obtained fluorescent material were measured and calculated. The results are shown in Table 2.

4. Experiment Example 3: $M^1$=Y, Li Additive Free, Mg Addition

Example 3-1

A fluorescent material $(Sr_{0.99}Ba_{0.85}Eu_{0.03}Y_{0.03}SiO_{3.915} \cdot 0.3MgO)$ was obtained in the same manner as in Example 2-1 except that the lithium carbonate was not added in Example 2-1, and mixing was performed so that the mixing ratio of Table 1 was set. The absorption factor, internal quantum efficiency, and external quantum efficiency of the obtained fluorescent material were measured and calculated. The results are shown in Table 2.

Comparative Examples 3-1 to 3-3

Fluorescent materials were obtained in the same manner as in Example 3-1 except that additive free (Comparative Example 3-1), the zinc oxide (Comparative Example 3-2) of the experiment example 1, and the aluminum oxide (Comparative Example 3-3) of the experiment example 1 were used in place of the powdery yttrium oxide of Example 3-1, and mixing was performed so that the mixing ratio of Table 1 was set. The absorption factor, internal quantum efficiency, and external quantum efficiency of the obtained fluorescent material were measured and calculated. The results are shown in Table 2.

5. Experiment Example 4: $M^1$=Y, Tb, Li Addition, Mg Addition

Example 4-1

A fluorescent material $(Sr_{1.005}Ba_{0.85}Eu_{0.025}Y_{0.01}Li_{0.01}SiO_{3.9} \cdot 0.3MgO)$ was obtained in the same manner as in Example 2-1 except that mixing was performed so that the mixing ratio of Table 1 was set in Example 2-1. The absorption factor, internal quantum efficiency, and external quantum efficiency of the obtained fluorescent material were measured and calculated. The results are shown in Table 2.

Example 4-2

A fluorescent material $(Sr_{1.005}Ba_{0.85}Eu_{0.025}Tb_{0.01}Li_{0.01}SiO_{3.9} \cdot 0.3MgO)$ was obtained in the same manner as in Example 4-1 except that terbium oxide (purity: 99.9% by mass) was used in place of the yttrium oxide in Example 4-1, and mixing was performed so that the mixing ratio of Table 1 was set. The absorption factor, internal quantum efficiency, and external quantum efficiency of the obtained fluorescent material were measured and calculated. The results are shown in Table 2.

Comparative Examples 4-1 to 4-5

Fluorescent materials were obtained in the same manner as in Example 4-1 except that additive free (purity: 99.9% by mass: Comparative Example 4-1), cerium oxide (purity: 99.9% by mass: Comparative Example 4-2), lanthanum oxide (purity: 99.9% by mass: Comparative Example 4-3), tungstic oxide (purity: 99.9% by mass: Comparative Example 4-4), gadolinium oxide (purity: 99.9% by mass: Comparative Example 4-5) were used in place of the powdery yttrium oxide of Example 4-1, and mixing was performed so that the mixing ratio of Table 1 was set. The absorption factor, internal quantum efficiency, and external quantum efficiency of the obtained fluorescent material were measured and calculated. The results are shown in Table 2.

TABLE 1

| | Mixing ratios of raw materials | | | | | | | | |
|---|---|---|---|---|---|---|---|---|---|
| | $SrCO_3$ | $BaCO_3$ | $Eu_2O_3$ | $SiO_2$ | MgO | $SrF_2$ | $SrBr_2$ | $Y_2O_3$ | ZnO |
| Example 1-1 | 0.94 | 0.95 | 0.015 | 1 | | 0.01 | 0.01 | 0.015 | |
| Comparative Example 1-1 | 1 | 0.95 | 0.015 | 1 | | 0.01 | 0.01 | | |
| Comparative Example 1-2 | 0.94 | 0.95 | 0.015 | 1 | | 0.01 | 0.01 | | 0.03 |
| Comparative Example 1-3 | 0.94 | 0.95 | 0.015 | 1 | | 0.01 | 0.01 | | |
| Example 2-1 | 0.94 | 0.85 | 0.015 | 1 | 0.3 | 0.01 | 0.01 | 0.015 | |
| Comparative Example 2-1 | 1 | 0.85 | 0.015 | 1 | 0.3 | 0.01 | 0.01 | | |
| Comparative Example 2-2 | 0.94 | 0.85 | 0.015 | 1 | 0.3 | 0.01 | 0.01 | | 0.03 |
| Comparative Example 2-3 | 0.94 | 0.85 | 0.015 | 1 | 0.3 | 0.01 | 0.01 | | |
| Example 3-1 | 0.97 | 0.85 | 0.015 | 1 | 0.3 | 0.01 | 0.01 | 0.015 | |
| Comparative Example 3-1 | 1 | 0.85 | 0.015 | 1 | 0.3 | 0.01 | 0.01 | | |
| Comparative Example 3-2 | 0.97 | 0.85 | 0.015 | 1 | 0.3 | 0.01 | 0.01 | | 0.03 |
| Comparative Example 3-3 | 0.97 | 0.85 | 0.015 | 1 | 0.3 | 0.01 | 0.01 | | |
| Example 4-1 | 0.985 | 0.85 | 0.0125 | 1 | 0.3 | 0.01 | 0.01 | 0.005 | |
| Example 4-2 | 0.985 | 0.85 | 0.0125 | 1 | 0.3 | 0.01 | 0.01 | | |
| Comparative Example 4-1 | 1.005 | 0.85 | 0.0125 | 1 | 0.3 | 0.01 | 0.01 | | |
| Comparative Example 4-2 | 0.985 | 0.85 | 0.0125 | 1 | 0.3 | 0.01 | 0.01 | | |
| Comparative Example 4-3 | 0.985 | 0.85 | 0.0125 | 1 | 0.3 | 0.01 | 0.01 | | |
| Comparative Example 4-4 | 0.985 | 0.85 | 0.0125 | 1 | 0.3 | 0.01 | 0.01 | | |
| Comparative Example 4-5 | 0.985 | 0.85 | 0.0125 | 1 | 0.3 | 0.01 | 0.01 | | |

| | Mixing ratios of raw materials | | | | | | |
|---|---|---|---|---|---|---|---|
| | $Al_2O_3$ | $Tb_2O_3$ | $Ce_2O_3$ | $La_2O_3$ | $W_2O_3$ | $Gd_2O_3$ | $Li_2CO_3$ |
| Example 1-1 | | | | | | | 0.015 |
| Comparative Example 1-1 | | | | | | | |
| Comparative Example 1-2 | | | | | | | 0.015 |
| Comparative Example 1-3 | 0.015 | | | | | | 0.015 |
| Example 2-1 | | | | | | | 0.015 |
| Comparative Example 2-1 | | | | | | | |
| Comparative Example 2-2 | | | | | | | 0.015 |
| Comparative Example 2-3 | 0.015 | | | | | | 0.015 |
| Example 3-1 | | | | | | | |
| Comparative Example 3-1 | | | | | | | |
| Comparative Example 3-2 | | | | | | | |
| Comparative Example 3-3 | 0.015 | | | | | | |
| Example 4-1 | | | | | | | 0.005 |
| Example 4-2 | | 0.005 | | | | | 0.005 |
| Comparative Example 4-1 | | | | | | | |
| Comparative Example 4-2 | | | 0.005 | | | | |

TABLE 1-continued

| | | | |
|---|---|---|---|
| Comparative Example 4-3 | 0.005 | | 0.005 |
| Comparative Example 4-4 | | 0.005 | 0.005 |
| Comparative Example 4-5 | | 0.005 | 0.005 |

TABLE 2

| | Composition | Absorption factor | Internal | External |
|---|---|---|---|---|
| Example 1-1 | $Sr_{0.96}Ba_{0.95}Eu_{0.03}Y_{0.03}Li_{0.03}SiO_4$ | 84.6 | 81.1 | 68.5 |
| Comparative Example 1-1 | $Sr_{1.02}Ba_{0.95}Eu_{0.03}SiO_4$ | 75.6 | 78.2 | 59.2 |
| Example 2-1 | $Sr_{0.96}Ba_{0.85}Eu_{0.03}Y_{0.03}Li_{0.03}SiO_{3.9} \cdot 0.3MgO$ | 83.6 | 83.8 | 70.0 |
| Comparative Example 2-1 | $Sr_{1.02}Ba_{0.85}Eu_{0.03}SiO_{3.9} \cdot 0.3MgO$ | 83.6 | 78.1 | 65.3 |
| Comparative Example 2-2 | $Sr_{0.96}Ba_{0.85}Eu_{0.03}Zn_{0.03}Li_{0.03}SiO_{3.9} \cdot 0.3MgO$ | 81.6 | 75.6 | 61.7 |
| Comparative Example 2-3 | $Sr_{0.96}Ba_{0.85}Eu_{0.03}Al_{0.03}Li_{0.03}SiO_{3.9} \cdot 0.3MgO$ | 80.3 | 40.9 | 32.8 |
| Example 3-1 | $Sr_{0.99}Ba_{0.85}Eu_{0.03}Y_{0.03}SiO_{3.915} \cdot 0.3MgO$ | 80.4 | 85.3 | 68.6 |
| Comparative Example 3-1 | $Sr_{1.02}Ba_{0.85}Eu_{0.03}SiO_{3.9} \cdot 0.3MgO$ | 83.6 | 78.1 | 65.3 |
| Comparative Example 3-2 | $Sr_{0.99}Ba_{0.85}Eu_{0.03}Zn_{0.03}SiO_{3.9} \cdot 0.3MgO$ | 82.7 | 80.3 | 66.4 |
| Comparative Example 3-3 | $Sr_{0.99}Ba_{0.85}Eu_{0.03}Al_{0.03}SiO_{3.915} \cdot 0.3MgO$ | 79.7 | 43.3 | 34.5 |
| Example 4-1 | $Sr_{1.005}Ba_{0.85}Eu_{0.025}Y_{0.01}Li_{0.01}SiO_{3.9} \cdot 0.3MgO$ | 82 | 83.2 | 68.2 |
| Example 4-2 | $Sr_{1.005}Ba_{0.85}Eu_{0.025}Tb_{0.01}Li_{0.01}SiO_{3.9} \cdot 0.3MgO$ | 81.9 | 82.2 | 67.3 |
| Comparative Example 4-1 | $Sr_{1.025}Ba_{0.85}Eu_{0.025}SiO_{3.9} \cdot 0.3MgO$ | 81.4 | 80.4 | 65.4 |
| Comparative Example 4-2 | $Sr_{1.005}Ba_{0.85}Eu_{0.025}Ce_{0.01}Li_{0.01}SiO_{3.9} \cdot 0.3MgO$ | 83.2 | 75.5 | 62.8 |
| Comparative Example 4-3 | $Sr_{1.005}Ba_{0.85}Eu_{0.025}La_{0.01}Li_{0.01}SiO_{3.9} \cdot 0.3MgO$ | 83.1 | 77.4 | 64.3 |
| Comparative Example 4-4 | $Sr_{1.005}Ba_{0.85}Eu_{0.025}W_{0.01}Li_{0.01}SiO_{3.9} \cdot 0.3MgO$ | 82.0 | 52.8 | 43.3 |
| Comparative Example 4-5 | $Sr_{1.005}Ba_{0.85}Eu_{0.025}Gd_{0.01}Li_{0.01}SiO_{3.9} \cdot 0.3MgO$ | 82.7 | 77.6 | 64.1 |

It is found that, regarding each of the experiment examples 1 to 4, Examples containing Y and Tb as $M^1$ have more excellent internal quantum efficiency and external quantum efficiency than those of Comparative Examples which do not contain Y and Tb or contain the other metal when Examples and Comparative Examples are compared with each other.

When Example 1-1 is compared with Example 2-1, it is found that Example 2-1 containing Mg has more excellent internal quantum efficiency and external quantum efficiency than those of Example 1-1 which does not contain Mg. When Example 2-1 is compared with Example 3-1, it is found that Example 2-1 containing Li has more excellent internal quantum efficiency and external quantum efficiency than those of Example 1-1 which does not contain Li. This shows that the combination use of Mg and Li provides more excellent light-emitting property than that of the single use of Mg or Li.

6. Experiment Example 5: $M^1$=Y (Content Variation), Li Addition, Mg Addition, x=0.025

Example 5-1

A fluorescent material $(Sr_{0.05}Ba_{0.85}Eu_{0.025}Y_{0.005}Li_{0.005}SiO_{3.9} \cdot 0.3MgO)$ was obtained in the same manner as in Example 2-1 except that mixing was performed so that the mixing ratio of Table 3 was set in Example 2-1. The absorption factor, internal quantum efficiency, and external quantum efficiency of the obtained fluorescent material were measured and calculated. The results are shown in Table 4.

Examples 5-2 to 5-6, Comparative Example 5-1

Fluorescent materials were obtained in the same manner as in Example 5-1 except that mixing was performed so that the mixing ratio of Table 3 was set in Example 5-1. The absorption factor, internal quantum efficiency, and external quantum efficiency of each of the obtained fluorescent materials were measured and calculated. The results are shown in Table 4.

7. Experiment Example 6: $M^1$=Y (Content Variation), Li Addition, Mg Addition, x=0.03

Example 6-1

A fluorescent material $(Sr_{1.0165}Ba_{0.85}Eu_{0.03}Y_{0.00175}Li_{0.00175}SiO_{3.9} \cdot 0.3MgO)$ was obtained in the same manner as in Example 2-1 except that mixing was performed so that the mixing ratio of Table 3 was set in Example 2-1. The absorption factor, internal quantum efficiency, and external quantum efficiency of the obtained fluorescent material were measured and calculated. The results are shown in Table 4.

Examples 6-2 to 6-7, Comparative Examples 6-1 to 6-5

Fluorescent materials were obtained in the same manner as in Example 6-1 except that mixing was performed so that the mixing ratio of Table 3 was set in Example 6-1. The absorption factor, internal quantum efficiency, and external quantum efficiency of each of the obtained fluorescent materials were measured and calculated. The results are shown in Table 4.

TABLE 3

| | Mixing ratios of raw materials | | | | | | | | | Additive amount of Y |
|---|---|---|---|---|---|---|---|---|---|---|
| | $SrCO_3$ | $BaCO_3$ | $Eu_2O_3$ | $SiO_2$ | MgO | $SrF_2$ | $SrBr_2$ | $Y_2O_3$ | $Li_2CO_3$ | (mass ppm) |
| Example 5-1 | 0.995 | 0.85 | 0.0125 | 1 | 0.3 | 0.01 | 0.01 | 0.0025 | 0.0025 | 1525 |
| Example 5-2 | 0.985 | 0.85 | 0.0125 | 1 | 0.3 | 0.01 | 0.01 | 0.005 | 0.005 | 3054 |
| Example 5-3 | 0.975 | 0.85 | 0.0125 | 1 | 0.3 | 0.01 | 0.01 | 0.0075 | 0.0075 | 4587 |
| Example 5-4 | 0.965 | 0.85 | 0.0125 | 1 | 0.3 | 0.01 | 0.01 | 0.01 | 0.01 | 6124 |
| Example 5-5 | 0.955 | 0.85 | 0.0125 | 1 | 0.3 | 0.01 | 0.01 | 0.0125 | 0.0125 | 7666 |
| Example 5-6 | 0.945 | 0.85 | 0.0125 | 1 | 0.3 | 0.01 | 0.01 | 0.015 | 0.015 | 9212 |
| Comparative Example 5-1 | 1.005 | 0.85 | 0.0125 | 1 | 0.3 | 0.01 | 0.01 | | | |
| Example 6-1 | 0.9965 | 0.85 | 0.015 | 1 | 0.3 | 0.01 | 0.01 | 0.000875 | 0.000875 | 502 |
| Example 6-2 | 0.99 | 0.85 | 0.015 | 1 | 0.3 | 0.01 | 0.01 | 0.0025 | 0.0025 | 1437 |
| Example 6-3 | 0.9 | 0.85 | 0.015 | 1 | 0.3 | 0.01 | 0.01 | 0.025 | 0.025 | 14536 |
| Example 6-4 | 0.98 | 0.85 | 0.015 | 1 | 0.3 | 0.01 | 0.01 | 0.005 | 0.005 | 3050 |
| Example 6-5 | 0.95 | 0.85 | 0.015 | 1 | 0.3 | 0.01 | 0.01 | 0.0125 | 0.0125 | 7657 |
| Example 6-6 | 0.94 | 0.85 | 0.015 | 1 | 0.3 | 0.01 | 0.01 | 0.015 | 0.015 | 9201 |
| Example 6-7 | 0.92 | 0.85 | 0.015 | 1 | 0.3 | 0.01 | 0.01 | 0.02 | 0.02 | 12302 |
| Comparative Example 6-1 | 1 | 0.85 | 0.015 | 1 | 0.3 | 0.01 | 0.01 | | | |
| Comparative Example 6-2 | 0.9994 | 0.85 | 0.015 | 1 | 0.3 | 0.01 | 0.01 | 0.00015 | 0.00015 | 86 |
| Comparative Example 6-3 | 0.9988 | 0.85 | 0.015 | 1 | 0.3 | 0.01 | 0.01 | 0.0003 | 0.0003 | 172 |
| Comparative Example 6-4 | 0.86 | 0.85 | 0.015 | 1 | 0.3 | 0.01 | 0.01 | 0.035 | 0.035 | 21707 |
| Comparative Example 6-5 | 0.8 | 0.85 | 0.015 | 1 | 0.3 | 0.01 | 0.01 | 0.05 | 0.05 | 31270 |

TABLE 4

| | Composition | Absorption factor | Internal | External |
|---|---|---|---|---|
| Example 5-1 | $Sr_{1.015}Ba_{0.85}Eu_{0.025}Y_{0.005}Li_{0.005}SiO_{3.9} \cdot 0.3MgO$ | 81.3 | 82.8 | 67.4 |
| Example 5-2 | $Sr_{1.005}Ba_{0.85}Eu_{0.025}Y_{0.01}Li_{0.01}SiO_{3.9} \cdot 0.3MgO$ | 82 | 83.2 | 68.2 |
| Example 5-3 | $Sr_{0.995}Ba_{0.85}Eu_{0.025}Y_{0.015}Li_{0.015}SiO_{3.9} \cdot 0.3MgO$ | 80.5 | 84.8 | 68.3 |
| Example 5-4 | $Sr_{0.985}Ba_{0.85}Eu_{0.025}Y_{0.02}Li_{0.02}SiO_{3.9} \cdot 0.3MgO$ | 81.3 | 84 | 68.4 |
| Example 5-5 | $Sr_{0.975}Ba_{0.85}Eu_{0.025}Y_{0.025}Li_{0.025}SiO_{3.9} \cdot 0.3MgO$ | 80.7 | 85.6 | 69.1 |
| Example 5-6 | $Sr_{0.965}Ba_{0.85}Eu_{0.025}Y_{0.03}Li_{0.03}SiO_{3.9} \cdot 0.3MgO$ | 81.5 | 83.9 | 68.4 |
| Comparative Example 5-1 | $Sr_{1.025}Ba_{0.85}Eu_{0.025}SiO_{3.9} \cdot 0.3MgO$ | 81.4 | 80.4 | 65.4 |
| Example 6-1 | $Sr_{1.0165}Ba_{0.85}Eu_{0.03}Y_{0.00175}Li_{0.00175}SiO_{3.9} \cdot 0.3MgO$ | 83.6 | 81.9 | 68.4 |
| Example 6-2 | $Sr_{1.01}Ba_{0.85}Eu_{0.03}Y_{0.005}Li_{0.005}SiO_{3.9} \cdot 0.3MgO$ | 82.0 | 84.2 | 69.0 |
| Example 6-3 | $Sr_{0.92}Ba_{0.85}Eu_{0.03}Y_{0.05}Li_{0.05}SiO_{3.9} \cdot 0.3MgO$ | 80.9 | 81.7 | 66.2 |
| Example 6-4 | $Sr_{1.00}Ba_{0.85}Eu_{0.03}Y_{0.01}Li_{0.01}SiO_{3.9} \cdot 0.3MgO$ | 82.8 | 84.1 | 69.7 |
| Example 6-5 | $Sr_{0.97}Ba_{0.85}Eu_{0.03}Y_{0.025}Li_{0.025}SiO_{3.9} \cdot 0.3MgO$ | 82.7 | 81.5 | 67.4 |
| Example 6-6 | $Sr_{0.96}Ba_{0.85}Eu_{0.03}Y_{0.03}Li_{0.03}SiO_{3.9} \cdot 0.3MgO$ | 83.6 | 83.8 | 70.0 |
| Example 6-7 | $Sr_{0.94}Ba_{0.85}Eu_{0.03}Y_{0.04}Li_{0.04}SiO_{3.9} \cdot 0.3MgO$ | 83.2 | 82.6 | 68.7 |
| Comparative Example 6-1 | $Sr_{1.02}Ba_{0.85}Eu_{0.03}SiO_{3.9} \cdot 0.3MgO$ | 83.6 | 78.1 | 65.3 |
| Comparative Example 6-2 | $Sr_{1.0194}Ba_{0.85}Eu_{0.03}Y_{0.0003}Li_{0.0003}SiO_{3.9} \cdot 0.3MgO$ | 83.1 | 79.0 | 65.6 |
| Comparative Example 6-3 | $Sr_{1.0188}Ba_{0.85}Eu_{0.03}Y_{0.0006}Li_{0.0006}SiO_{3.9} \cdot 0.3MgO$ | 83.2 | 79.3 | 65.9 |
| Comparative Example 6-4 | $Sr_{0.88}Ba_{0.85}Eu_{0.03}Y_{0.07}Li_{0.07}SiO_{3.9} \cdot 0.3MgO$ | 80.3 | 71.3 | 57.2 |
| Comparative Example 6-5 | $Sr_{0.82}Ba_{0.85}Eu_{0.03}Y_{0.1}Li_{0.1}SiO_{3.9} \cdot 0.3MgO$ | 74.4 | 70.2 | 52.2 |

From the results of the experiment example 5 having an Eu content of 0.025 (molar ratio to 1 mol of silicon), it is found that Examples 5-1 to 5-6 having a Y content of 0.005 to 0.03 (molar ratio to 1 mol of silicon) have more excellent internal quantum efficiency and external quantum efficiency than those of Comparative Example 5-1 which does not contain Y. Similarly, from the results of the experiment example 6 having an Eu content of 0.03 (molar ratio to 1 mol of silicon), it is found that Examples 6-1 to 6-7 having a Y content of 0.00175 to 0.04 (molar ratio to 1 mol of silicon) have more excellent internal quantum efficiency and external quantum efficiency than those of Comparative Examples 6-1 which does not contain Y. It is found that both Comparative Examples 6-2, 6-3 having a Y content of less than 0.001 and Comparative examples 6-4, 6-5 having a Y content of more than 0.06 have a poorer internal quantum efficiency and external quantum efficiency than those of Examples.

The invention claimed is:

1. A fluorescent material having a composition represented by the following Formula (1):

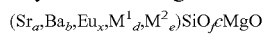

$(Sr_a,Ba_b,Eu_x,M^1{}_d,M^2{}_e)SiO_f \cdot cMgO$     Formula (1)

in the formula, $M^1$ being at least one tertiary group element selected from Y and Tb;

$M^2$ being an alkali metal selected from Li, Na, and K; and $0<a<2$, $0<b<2$, $0 \leq c<1$, $0.001 \leq d \leq 0.06$, $0 \leq e \leq 0.06$, $0.025 \leq x \leq 0.05$, and $3.7 \leq f \leq 4.1$ being set.

2. The fluorescent material according to claim 1, wherein the fluorescent material has an external quantum efficiency of 66% or more when being excited by excitation light having a wavelength of 400 nm.

3. A light-emitting device comprising:
the fluorescent material according to claim 1; and
a light source irradiating the fluorescent material with excitation light to cause the fluorescent material to emit light.

4. The fluorescent material according to claim 1, wherein a content of $M^1$ is 500 to 16000 ppm based on mass standard.

5. The fluorescent material according to claim 4, wherein the fluorescent material has an external quantum efficiency of 66% or more when being excited by excitation light having a wavelength of 400 nm.

6. The fluorescent material according to claim 1, wherein x is $0.025 \leq x \leq 0.03$.

7. The fluorescent material according to claim 6, wherein the fluorescent material has an external quantum efficiency of 66% or more when being excited by excitation light having a wavelength of 400 nm.

* * * * *

UNITED STATES PATENT AND TRADEMARK OFFICE
CERTIFICATE OF CORRECTION

PATENT NO. : 9,758,725 B2
APPLICATION NO. : 15/112215
DATED : September 12, 2017
INVENTOR(S) : Jin Amagai et al.

It is certified that error appears in the above-identified patent and that said Letters Patent is hereby corrected as shown below:

On the Title Page

Column 2, Item (57), Abstract, delete "$M^1{}_1$" and insert -- $M_1{}^d$ --

In the Claims

Column 13, Line 67, Claim 1, Line 3, delete "$(Sr_a, Ba_b, Eu_x, M^1{}_d, M^2{}_e)SiO_f cMgO$"
and insert -- $(Sr_a, Ba_b, Eu_x, M^1{}_d, M^2{}_e)SiO_f \cdot cMgO$ --

Signed and Sealed this
Nineteenth Day of December, 2017

Joseph Matal
*Performing the Functions and Duties of the
Under Secretary of Commerce for Intellectual Property and
Director of the United States Patent and Trademark Office*